United States Patent [19]

Meissner et al.

[11] Patent Number: 5,708,269

[45] Date of Patent: Jan. 13, 1998

[54] THERMAL DETECTOR AND METHOD

[75] Inventors: Edward G. Meissner, Dallas; Charles M. Hanson, Richardson, both of Tex.

[73] Assignee: Raytheon TI Systems, Inc., Lewisville, Tex.

[21] Appl. No.: 693,770

[22] Filed: Aug. 7, 1996

Related U.S. Application Data

[60] Provisional application No. 60/002,329 Aug. 15, 1995.

[51] Int. Cl.$^6$ .................................................. H01L 31/09
[52] U.S. Cl. .................... 250/332; 250/338.2; 250/338.4
[58] Field of Search ........................... 250/338.4, 338.2, 250/332

[56] References Cited

U.S. PATENT DOCUMENTS

| | | |
|---|---|---|
| 3,846,820 | 11/1974 | Lampe et al. . |
| 4,018,608 | 4/1977 | Frazier . |
| 4,080,532 | 3/1978 | Hopper . |
| 4,085,500 | 4/1978 | Hager et al. . |
| 4,142,207 | 2/1979 | McCormack et al. . |
| 4,143,269 | 3/1979 | McCormack et al. . |
| 4,162,402 | 7/1979 | Hopper . |
| 4,205,227 | 5/1980 | Reed . |
| 4,275,302 | 6/1981 | Imbert et al. . |
| 4,379,232 | 4/1983 | Hopper . |
| 4,411,732 | 10/1983 | Wotherspoon . |
| 4,447,291 | 5/1984 | Schulte . |
| 4,594,507 | 6/1986 | Elliott et al. . |
| 4,614,957 | 9/1986 | Arch et al. . |
| 4,615,595 | 10/1986 | Hornbeck . |
| 4,639,756 | 1/1987 | Rosbeck et al. . |
| 4,684,812 | 8/1987 | Tew et al. . |
| 4,705,361 | 11/1987 | Frazier et al. . |
| 4,710,732 | 12/1987 | Hornbeck . |
| 4,751,387 | 6/1988 | Robillard . |
| 4,948,976 | 8/1990 | Baliga et al. . |
| 4,956,619 | 9/1990 | Hornbeck . |
| 4,965,649 | 10/1990 | Zanio et al. . |
| 4,994,672 | 2/1991 | Cross et al. . |
| 5,010,251 | 4/1991 | Grinberg et al. . |
| 5,021,663 | 6/1991 | Hornbeck . |
| 5,047,644 | 9/1991 | Meissner et al. . |
| 5,051,591 | 9/1991 | Trotta et al. . |
| 5,061,049 | 10/1991 | Hornbeck . |
| 5,083,857 | 1/1992 | Hornbeck . |
| 5,113,076 | 5/1992 | Schulte . |
| 5,144,138 | 9/1992 | Kinch et al. . |
| 5,188,970 | 2/1993 | York et al. . |
| 5,196,703 | 3/1993 | Keenan . |
| 5,238,530 | 8/1993 | Douglas et al. . |
| 5,264,326 | 11/1993 | Meissner et al. . |
| 5,451,786 | 9/1995 | Kosai . |
| 5,559,332 | 9/1996 | Meissner et al. ........... 250/338.2 |

FOREIGN PATENT DOCUMENTS

| | | |
|---|---|---|
| 939943 | 1/1974 | Canada . |
| 2752704 | 6/1978 | Germany . |
| 2251952 | 7/1992 | United Kingdom . |
| 9116607 | 10/1991 | WIPO . |

OTHER PUBLICATIONS

Li, Bhalla and Cross, "Temperature Sensitivity of the Reflectance Coefficient of SbSI" *Ferroelectrics Letters* pp. 1–7 vol. 12 No. 1 Jul. 1990.

*Primary Examiner*—Constantine Hannaher

[57] ABSTRACT

A thermal imaging system (10) for providing an image representative of an amount of thermal radiation incident to the system is provided. The system (10) includes a thermal detector (28 or 30) made from a layer of temperature sensitive material forming a first element of a signal-producing circuit (54). The first element (28 or 30) has either a resistance or capacitance value depending on its temperature. The system (10) also includes an integrated circuit substrate (32) having a second element (56 or 58) of the signal-producing circuit (54) complementary and electrically coupled to the first element (28 or 30). The signal-producing circuit (54) may produce an output signal having a amplitude. The amplitude of the output signal is monitored as representing an absolute temperature of the detector (28 or 30) so as to determine the amount of thermal energy incident to the system (10).

30 Claims, 2 Drawing Sheets

THERMAL DETECTOR AND METHOD

This application claims priority under 35 USC §119(e)(1) of provisional application number 60/002,329, filed Aug. 15, 1995.

RELATED APPLICATIONS

This application is related to co-pending U.S. Pat. Nos. 5,425,304, 5,436,450, 5,512,748, 5,486,698 and 5,426,303 and application Ser. No. 08/334,666, filed Nov. 4, 1994, entitled *Thermal Detector and Method*, of the same assignee, Attorney's Docket TI-19288.

TECHNICAL FIELD OF THE INVENTION

This invention relates generally to infrared or thermal imaging systems, and more particularly, to uncooled thermal sensors that form a monolithic focal plane array.

BACKGROUND OF THE INVENTION

Infrared or thermal imaging systems typically use a plurality of thermal sensors to detect infrared radiation and produce an image capable of being visualized by the human eye. Thermal imaging systems typically detect thermal radiance differences between various objects in a scene and display these differences in thermal radiance as a visual image of the scene.

The basic components of a thermal imaging system generally include optics for collecting and focusing infrared radiation from a scene, an infrared detector or focal plane array (FPA) having a plurality of thermal sensors for converting infrared radiation to an electrical signal, and electronics for amplifying and processing the electrical signal into a visual display or for storage in an appropriate medium. A chopper is often necessary in thermal imaging systems to AC couple the detector to the scene. The electronic processing portion of the thermal imaging system will typically subtract the signal generated from the different chopper quadrants. An example of a thermal imaging system is described in U.S. Pat. No. 4,143,269, issued to McCormack, et al., entitled *Ferroelectric Imaging System*.

One type of thermal sensor includes a pyroelectric element formed from pyroelectric material that exhibits a state of electrical polarization and capacitance dependent upon temperature changes in response to incident infrared radiation. An infrared absorber and common electrode are disposed on one side of the pyroelectric elements. A sensor signal electrode may be disposed on the opposite side of each pyroelectric element. The infrared absorber and common electrode extend across the surface of the focal plane array and are attached to each of the pyroelectric elements. Each pyroelectric element generally has its own separate sensor signal electrode. Each infrared detector element or thermal sensor is defined in part by the infrared absorber and common electrode and the respective sensor signal electrode. The electrodes constitute capacitive plates and the pyroelectric element constitutes a dielectric disposed between the capacitive plates.

These previously developed thermal sensors often require a chopper in order to obtain a reference signal. The chopper must be driven by a drive source and must be synchronized with the readings taken at the thermal sensors. This increases the complexity and cost of the thermal imaging system. These additional elements also require power, and therefore, may result in a system that may not be suitable for long-term battery powered operation.

SUMMARY OF THE INVENTION

In accordance with the present invention, a thermal imaging system is provided that substantially eliminates or reduces disadvantages and problems associated with previously developed thermal imaging systems.

One aspect of the present invention may include a thermal imaging system for providing an image representative of an amount of thermal radiation incident to the system. The system includes a thermal detector made from a layer of ferroelectric material forming a first element of a signal-producing circuit. The first element has either a resistance or capacitance value depending on its temperature. The system also includes an integrated circuit substrate having a second element of the signal-producing circuit complementary and electrically coupled to the first element. The signal-producing circuit may produce an output signal having an amplitude. The amplitude of the output signal is monitored as representing an absolute temperature of the detector so as to determine the amount of thermal energy incident to the system.

Another aspect of the present invention may provide a method for producing an image representative of an amount of thermal radiation incident to a thermal imaging system. The method includes forming a layer of ferroelectric material as a thermal detector and first element of a signal-producing circuit. The first element has a resistance or capacitance value depending on its temperature. The method also includes forming a second element of the signal-producing circuit complementary and electrically coupled to the first element in an integrated circuit substrate. The method also includes providing an output signal having an amplitude from the signal-producing circuit with the amplitude of the output signal depending on the value of the first element and representing an absolute temperature of the detector. The method also includes monitoring the amplitude of the output signal of the signal-producing circuit so as to detect a change in the temperature of the thermal detector.

Yet another aspect of the present invention may provide a thermal imaging system for providing an image representative of an amount of thermal radiation incident to the system. The system includes a focal plane array including a plurality of thermal detectors. Each detector may include a layer of either ferroelectric material or bolometric material forming a first element of a signal-producing circuit. The first element has a resistance or capacitance value that depends on its temperature. The system also includes an integrated circuit substrate having a plurality of second elements. Each second element is part of one of a plurality of signal-producing circuits and is complementary and electrically coupled to an associated first element. Each signal-producing circuit may produce an output signal having a amplitude. The amplitude of each output signal is monitored as representing an absolute temperature of the detector so that the amount of thermal energy incident to the detector may be determined.

An important technical advantage of the present invention may include the elimination of a chopper for operation. This reduces the complexity of a system incorporating concepts of the present invention, making the system easier to operate and maintain. Eliminating the chopper and associated hardware also reduces the power requirements for the thermal imaging system making it more suitable for battery operation and allows for increased battery powered operating time. U.S. patent application Ser. No. 08/229,497, entitled *Self-Chopped Infrared Detector Array*, of the same assignee as the present application, Attorney's Docket TI-18868, also describes a system that does not require a separate chopper for operation.

Other technical advantages of the present invention may include possible reduction in the size of the detector when the thermal detector is an element of an RC filter circuit. Smaller detectors provide a technical advantage of increased pixel density and, in turn, increases the sensitivity for a thermal imaging system employing the present invention.

Further technical advantages of the present invention include fabrication in accordance with monolithic integrated circuit technologies that provide high performance and low manufacturing costs. Alternatively, the present invention may be fabricated using hybrid manufacturing techniques.

BRIEF DESCRIPTION OF THE DRAWINGS

For a more complete understanding of the present invention and the advantages thereof, reference is now made to the following descriptions taken in conjunction with the accompanying drawings, in which like reference numbers indicate like features and wherein.

DETAILED DESCRIPTION OF THE INVENTION

The preferred embodiments of the present invention are illustrated in FIGS. 1 through 5, like numerals being used to refer to like and corresponding parts of the various drawings.

Figure 1:
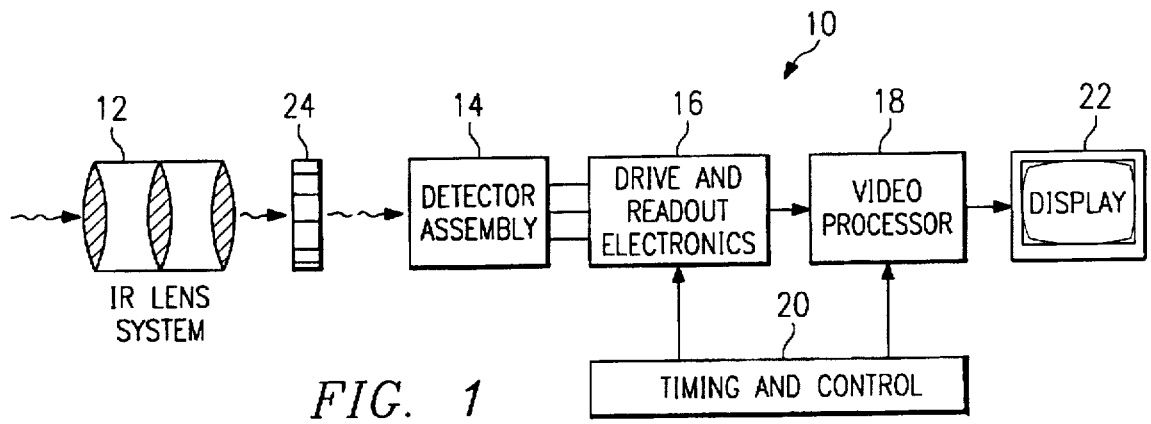
FIG. 1. is a block diagram of an exemplary thermal imaging system that may employ the present thermal sensor.

FIG. 1 shows thermal imaging system 10 including an infrared (IR) lens system 12, detector assembly 14, drive and readout electronics 16, video processor 18, timing and control 20, and display 22. Thermal imaging system 10 may also include chopper 24 that is, for example, a mechanical chopper for interrupting the flow of infrared energy to the surface of a focal plane array in detector assembly 14. Lens system 12 may be, for example, an infrared lens system having an object lens, correcting lens, and focusing lens for focusing thermal energy emanating from a scene (not explicitly shown) that is chopped by chopper 24 onto the focal plane array of detector assembly 14. It will be understood that various types of choppers and lens systems are capable of performing the desired optical functions of system 10.

The focal plane array of detector assembly 14 includes a plurality of thermal energy detectors for producing electrical signals representative of the thermal energy impinging on each thermal detector. The electrical signals may be processed by drive and readout electronics 16 and then supplied to video processor 18. The focal plane array of detector assembly 14 is more fully described later.

Videoprocessor 18 processes the signals representative of the scene into display signals for display. Display 22 may be, for example, a cathode ray tube, and video processor 18 may be used for processing electrical signals into a television format. Drive and readout electronics 16 are coupled to the focal plane array of detector assembly 14 for processing the electrical signals representative of the scene from detector assembly 14. Timing control 20 guides the action of the chopper 24 when provided, drive and readout electronics 16, and videoprocessor 18, to selectively produce signals of the scene in a desired format for display 22.

Figure 2:
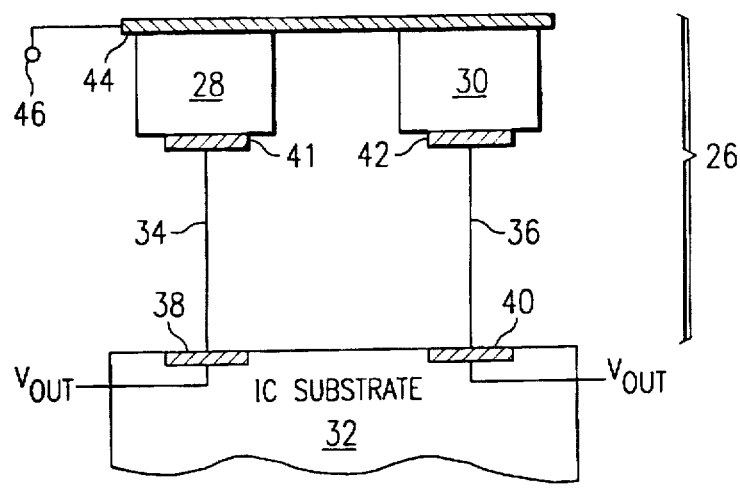
FIG. 2 is a schematic representation of an network.

FIG. 2 is a schematic representation of focal plane array 26 containing detectors 28 and 30. Focal plane array 26 would be suitable for use in detector assembly 14 of thermal imaging system 10 of FIG. 1. Detectors 28 and 30 are coupled to integrated circuit (IC) substrate 32 by signal leads 34 and 36, respectively. IC substrate 32 includes contact pad 38 coupled to signal lead 34 and contact pad 40 coupled to signal lead 36. Focal plane array 26 includes detector contact pad 41 coupling detector 28 to signal lead 34 and contact pad 42 coupling detector 30 to signal lead 36. Also coupled to detectors 28 is contact pad 44 receiving input signal 46. Contact pad 44 also provides input signal 46 to detector 30. Output signals from detectors 28 and 30 are provided to IC substrate 32 by signal leads 34 and 36 respectively. Each detector 28 and 30 may be made from a ferroelectric or bolometric material such as, for example, barium strontium titanate (BST), barium titanate, antimony sulfoiodide, vanadium oxide, lead titanate, lead lanthanum zirconium titanate, polysilicon, and amorphous silicon.

In one embodiment of the present invention, each detector 28 and 30 forms a capacitive element. Continuing the example of FIG. 2, the ferroelectric material of detector 28 would be the dielectric between capacitive plates represented by contact pads 41 and 44. Incident infrared radiation causes a temperature change in ferroelectric detector 28. This temperature change results in a change in capacitance between the contacts associated with detector 28. This change in capacitance will result in a change in the attenuation of a signal inserted into a RC network using detector 28 as a capacitor. A change in the attenuation of the input signal may be used to determine the thermal energy incident to focal plane array 26.

In an alternative embodiment, detectors 28 and 30 provide resistive elements made from, bolometric material. In this embodiment of focal plane array 26, since a bolometric material's electrical resistance is dependent upon the material's temperature, incident infrared radiation causes a temperature change in bolometric elements 28 and 30 resulting in a change in their resistance. This change in resistance may be used to measure the change in thermal energy incident at focal plane array 26. It is noted that the present invention is not limited to the configuration of focal plane array 26 of FIG. 2. Other detectors may be used without departing from the concepts of the present invention.

In accordance with the present invention, the difference between the scene temperature and array temperature is transformed into a signal by the value of a detector, whether capacitive or resistive. Because the value of the detector is very sensitive to temperature near the curie point, if the detector is one leg of a resistor (R) and capacitor (C) filter, hereinafter RC filter, the amplitude of the signal provided by the RC filter will be a direct measure of the scene-array temperature differential. This is true whether the detector is resistive or capacitive.

It is known that the amplitude of a signal provided by a RC filter depends on the values of the resistor and capacitor in the RC filter. For a ferroelectric material having a temperature near the curie temperature, the capacitive value of the ferroelectric material (at low field) is a very strong function of temperature. A temperature dependant detector may be made part of a RC filter circuit and the output of the circuit may be monitored. As the value of the detector element changes, the amplitude of the output signal from the filter circuit changes. By setting the amplitude of the input signal to a predetermined value and by monitoring the amplitude of the signal output by the RC filter circuit, the absolute temperature of each detector within a focal plane array may be determined. This principle may be applied with both a capacitive detector made from ferroelectric material and a resistive detector made from bolometric material. This eliminates the need for chopper 24 of system 10 in FIG. 1, although chopper 24 may be included.

Figure 3A:
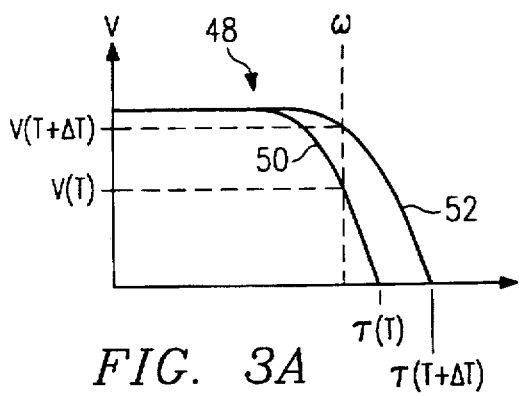
FIG. 3A shows exemplary response curves for a RC network.

FIG. 3A shows a frequency response curve for a RC network or filter, where the frequency of the input signal in radians per second ($\omega$) is shown on the X-axis and the amplitude of the output signal (V) is shown on the Y-axis. Frequency response curve 48 as shown in FIG. 3A has two curved "active regions" or "edge regions," 50 and 52. The differences in regions 50 and 52 is due to a change in capacitance or resistance in the RC network.

As shown in FIG. 3A, when a signal of a known amplitude having a frequency in the regions of curves 50 and 52 is input into an RC network an expected output V is provided. This output V can be measured at a first temperature T resulting in V(T) as shown in FIG. 3A. As either the capacitance or resistance of the RC network changes due to a change in temperature ($\Delta T$) the response curve of the RC network will change. This is represented by region 52 of curve 48. This in turn causes the output voltage to change to V(T+$\Delta T$). By this way, a change in temperature of an element within an RC network can be detected.

Frequency in radians/sec ($\omega$) may be represented as:

$$\omega = 2\Pi f$$

where f=frequency in Hz.

Additionally, it is known that the corner frequency ($\tau$) of a high pass filter is a factor of resistance (R) and capacitance (C), where $\tau$=RC. Also, for a high pass filter it is known that:

$$V_{OUT} = V_{IN} \frac{i\omega\tau}{1 + i\omega\tau}$$

Therefore, $$\frac{dV_{OUT}}{dT} = \frac{i\omega\tau}{(1 + i\omega\tau)^2} V_{IN} \frac{1}{C} \left( \frac{dC}{dT} \right)$$

Alternatively, $$\frac{dV_{OUT}}{dT} = \frac{i\omega\tau}{(1 + i\omega\tau)^2} V_{IN} \frac{1}{R} \left( \frac{dR}{dT} \right)$$

Figure 3B:
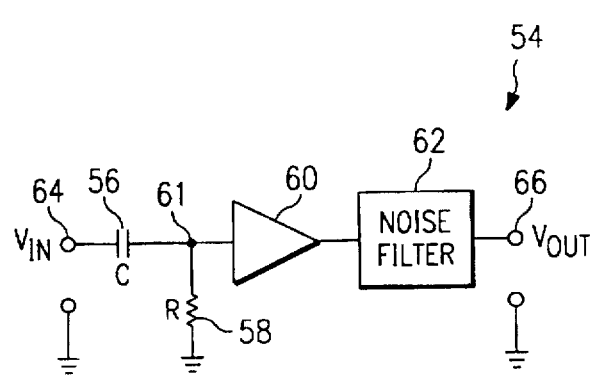
FIG. 3B shows a circuit schematic of a single pixel for implementing aspects of the present invention.

FIG. 3B shows RC filter circuit 54. Based on the type of material used to make the ferroelectric detector, for example detectors 28 or 30 of FIG. 2, the detector may be made either the capacitive or resistive element of RC filter circuit 54. RC filter circuit 54 includes capacitor C 56 coupled in series with resistor R 58. Capacitor C 56 and resistor R 58 are complimentary in that together they form an RC filter circuit and changing the value of either affects the signal produced by RC filter circuit 54. This series combination of C 56 and R 58 are coupled to the input of amplifier 60. It is noted that positions of capacitor C 56 and resistor R 58 in circuit 54 may be switched without deviating from the inventive aspects of the present invention. Coupled in series with the output of amplifier 60 is noise filter 62. The input to RC filter circuit 54 is represented by $V_{IN}$ 64, while the output is represented by $V_{OUT}$ 66. The resistive or capacitive elements of RC filter circuit 54 may be embodied in a ferroelectric detector of a focal plane array, for example detectors 28 and 30 of focal plane array 26 of FIG. 2. By making one of the elements of RC filter circuit 54 a detector within a focal plane array, and by knowing the remaining values for the elements within RC filter circuit 54, the temperature of the detector may be determined.

In operation of the RC filter circuit 54, $V_{IN}$ 64 may be an alternating current (AC) signal of a predetermined amplitude. The frequency (f) of the signal at $V_{IN}$ (64) should be constant and should be at a rate that is much greater than the sample time of the system at each detector. This allows the amplitude of the signal provided by a given detector to be measured several times when the detector is polled by the system. Additionally, in the preferred embodiment of the present invention, the signal at $V_{IN}$ 64 should be a high frequency signal so as to minimize 1/f noise in the system.

By monitoring the amplitude of $V_{OUT}$ 66 the temperature at a detector in a focal plane array may be determined. Using the example of FIG. 2, assuming detector 28 is embodied in C 56, then the remaining elements of RC circuit 54, including R 58, amplifier 60, and noise filter 62 would be formed of known values in IC substrate 32. Alternatively, resistor R 50 may also be in the focal plane array with the remainder of circuit 54 in IC substrate 32. $V_{OUT}$ 66 could also be located in IC substrate 32. As the value of C 56 changes due to the impingement of infrared energy on detector 28, the amplitude of the signal at $V_{OUT}$ 66 changes. This change in the output signal's amplitude may be processed in order to determine the change in temperature of detector 28 (C 56) in focal plane array 26.

In an alternative application of RC filter circuit 54, detectors 28 and 30 of focal plane array 26 are made resistive so that they may be used as R 58. Infrared energy impinging on a resistive detector changes the resistance value for the detector. This changes the amplitude of the output signal from the RC filter circuit. The amplitude of $V_{OUT}$ 66 may be monitored to determine the temperature at focal plane array 26. It is noted that the size of a resistive type detector in accordance with the present invention may be much smaller than capacitive type detectors previously developed. This helps reduce the physical size necessary to build a focal plane array incorporating concepts of the present invention and also allows for increasing the density of detectors within the focal plane array.

It is noted that the inventive concepts of the present invention are not limited to high pass RC filter circuits nor to the RC filter circuit depicted in FIG. 3B. Alternate configurations of RC filer circuit 54 and many other RC circuits may be used without departing from the inventive concepts of the present invention. For example, while a high pass filter is depicted in FIG. 3B, a low pass filter could be used without departing from the invention concepts of the present invention.

Normalization of the present detector within a RC network may be required. Normalization will, however, be easy to accomplish because the complementary resistor of the RC network (when the detector is capacitive) in the IC substrate may be set to match the measured capacitance of the detector. This may be accomplished by adjusting the level of resistance by laser cutting thick film resistors on the IC substrate prior to bonding the detector and the IC substrate with one another or any other commercially available method. Alternatively, normalization may be achieved by programming a transistor network either on the IC substrate or as part of a separate device.

The monitoring of the amplitude of the output signal from a RC filter circuit incorporating a ferroelectric temperature sensitive detector may be accomplished by many techniques. It may be desirable to amplify the signal provided by the RC filter so that the change in amplitude of the signal may be more easily detected. Amplifier 60 may be included in RC filter circuitry to provide the necessary amplification of the signal provided at node 61.

Additionally, to further enhance the performance of the present invention, it may be desirable to provide noise filter 62 with RC filter circuit 54. The detector that is made part of either C 56 or R 58 of circuit 54 may be adversely affected by noise sources. In particular, l/f noise may detract from the proper operation of circuit 54. Noise filter 62 may be used to filter out any noise that would adversely affect the signal provided at $V_{OUT}$ 66. Noise filter 62 may help ensure a more accurate reading of the change in amplitude of $V_{OUT}$ 66 so that the change in temperature of the thermal detector is accurately obtained.

Figure 4:
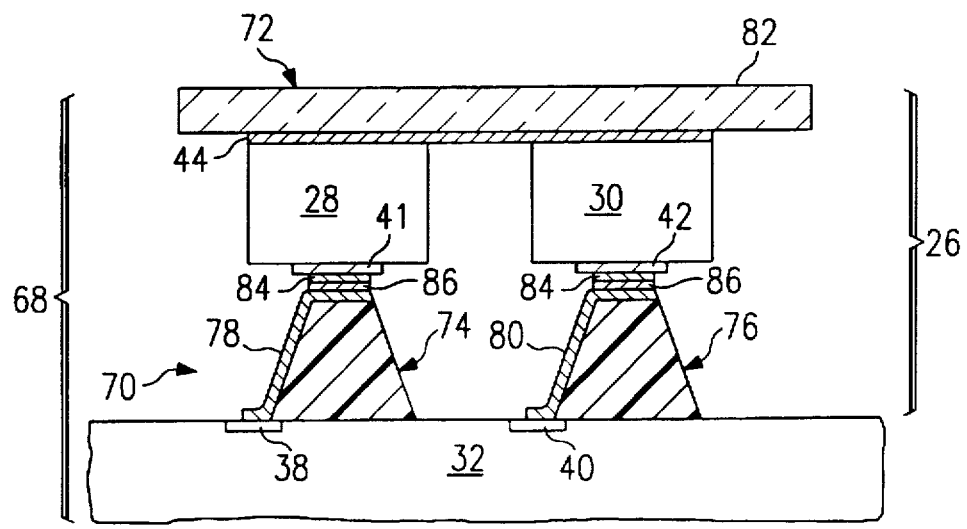
FIG. 4 is a schematic view in section with portions broken away showing a thermal sensor detector having a focal plane array, thermal isolation structure, and integrated circuit substrate, incorporating an embodiment of the present invention.

FIG. 4 is a cross-sectional view of a possible structure for focal plane array 26 and IC Substrate 32 of FIG. 2, collectively referred to hereinafter as thermal imaging system 68. Some of the principal components or structures that comprise thermal imaging system 68 include focal plane array 26, thermal isolation structure 70, and integrated circuit substrate 32. Focal plane array 26 comprises a plurality of thermal detectors, including detectors 28 and 30. The quantity and location of thermal detectors will depend upon the desired row and column configuration for focal plane array 26.

Thermal isolation structure 70 is used to provide mechanical support during bonding of focal plane array 26 with integrated circuit substrate 32 and to thermally insulate focal plane array 26 from integrated circuit substrate 32. For some embodiments of the present invention, thermal isolation structure 70 may be used to support focal plane array 26 during formation of separate infrared absorber assembly 72. Also, thermal isolation structure 70 provides an electrical interface between thermal detectors 28 and 30 in focal plane array 26 and IC substrate 32. This electrical interface allows the detectors of focal plane array 26 to be part of a RC filter circuit embedded in IC substrate 32 in accordance with the concepts of the present invention.

The components of focal plane array 26 include a plurality of thermal detectors, e.g., 28 and 30, and infrared absorber assembly 72. Detector 28 is coupled to signal contact pad 41 and contact pad 44. Detector 30 is coupled to signal contact pad 42 and contact pad 44. It is noted that contact pad 44 may be embodied in a single conductive layer that contacts all the detectors within focal plane array 26. One side of both detectors 28 and 30 may contact infrared absorber assembly 72.

Incident infrared radiation will interact with infrared absorber assembly 72 and produce a temperature change in the attached elements 28 and 30. The temperature change will vary the capacitance (or resistance) of the ferroelectric elements 28 and 30. The representative output signals at ($V_o$) contact pads 38 or 40 will depend upon the capacitance (or resistance) of the associated elements 28 and 30, which, in turn, is a function of the incident infrared radiation. Output signals at contact pads 38 and 40 from detectors 28 and 30 respectively, may then be used in a RC filter circuit embedded in IC substrate 32 so that a change in capacitance (or resistance) in a detector may be used to monitor temperatures within focal plane array 26. Alternatively, both elements of the RC filter circuit may be part of focal plane array 26.

Ferroelectric elements 28 and 30 of focal plane array 26 are isolated thermally from one another and from IC substrate 32 to insure that the capacitance (or resistance) associated with each thermal detector accurately represents the incident infrared radiation. Each thermal detector in focal plane array 26 is individually coupled to IC substrate 32 by a mesa-type structure provided by thermal isolation structure 70. Detector 28 is coupled to mesa-type structure 74 and detector 30 is coupled to mesa-type structure 76. Each thermal detector is preferably coupled electrically through its associated mesa-type structures to corresponding contact pads on IC substrate 32.

The size of each mesa-type structure 74 and 76 will be dictated primarily by structural and thermal capacitance and resistance considerations. Signal leads 34 and 36 of FIG. 2 are embodied in metal strips 78 and 80 respectively along the side of their associated mesa-type structure 74 and 76.

Infrared absorber assembly 72 preferably comprises a layer of infrared absorber or optical coating 82 formed from infrared absorbing material. For some applications, layer 82 may include multiple layers of infrared sensitive material depending upon the specific wavelength or wavelengths of infrared radiation that thermal imaging system 68 is designed to detect. Infrared absorber assembly 72 may perform several important functions such as increasing the interaction of incident infrared radiation with optical coating 82. Also, contact pad 44 coupled with optional coating 82 preferably has low thermal conductance to prevent rapid transfer of heat energy between ferroelectric elements 28 and 30.

For one embodiment of the present invention, contact pad 44 may be formed from metal such as NiCr, which has both low thermal and good electrical conductivity for this application and cooperates with optical coating 82 to enhance the absorption of incident infrared radiation. For other embodiments of the present invention, materials other than metal that have the desired characteristics may be used to form contact pad 44. The present invention is not limited to use with only metal contact pad 44.

Metallic bonding material 84 is preferably provided on signal lead electrodes 41 and 42 to form a bump bond with similar metallic bonding material 86 on each associated mesa-type structure. For some applications conductive epoxy bonding may be satisfactorily used to mount thermal detectors 28 and 30 on their associated mesa-type structures 74 and 76.

For thermal detectors 28 and 30, thermal (infrared) radiation incident to focal plane array 26 is absorbed by the respective infrared absorber or optical coating 82 and transmitted as heat through contact pad 44 into the adjacent elements 28 and 30. The resulting temperature change in elements 28 and 30 causes a change in the capacitance (or resistance) in the detectors. The change in capacitance (or resistance) causes a change in the amplitude of the signal produced by the RC filter circuit containing detector 28 or 30. The change in amplitude may be used to determine the temperature of the detectors within focal plane array 26.

Integrated circuit substrate 32 includes the remaining elements of the RC filter circuit used in accordance with the present invention. Integrated circuit substrate 32 is bonded to focal plane array 26, with contact pads 38 and 40 being electrically coupled to their corresponding signal mesa strip conductors 78 and 80. Thermal isolation structure 70 prevents IC substrate 32 from acting as a heat sink for the thermal energy stored in ferroelectric detectors 28 and 30 and adversely affecting the capacitance (or resistance) of the detectors.

Mesa strip conductors 78 and 80 provide a signal path between the top of each mesa-type structure and the adjacent contact pad. For example, mesa strip conductor 78 provides an electrical path from contact pad 38 to the top of mesa-type structure 74. Recommended materials for mesa strip conductors 78 and 80 include titanium and tungsten alloys because of their relatively low thermal conductivity and ease of application.

Indium bump bonding techniques may be satisfactorily used to form metal bonds between focal plane array 26 and thermal isolation structure 70. The configurations of mesa-type structures 74 and 76 and the associated mesa strip conductors 78 and 80 are design choices, largely dependent upon thermal isolation and structural rigidity considerations. Alternative configurations for mesa-type structures 74 and 76 include mesas with sloping sidewalls and mesas with vertical sidewalls. For sloped sidewall mesa-type structures 74 and 76, a mesa strip configuration for conductors 78 and 80 is recommended. For a vertical sidewall mesa, a mesa-contour configuration as shown in U.S. Pat. No. 5,047,644, entitled *Polyimide Thermal Isolation Mesa For a Thermal Imaging System*, may be more appropriate. These configurations are exemplary only, and any other thermal isolation structure may be used for both the mesa-type structures 74 and 76 and their associated conductors 78 and 80. In particular, while mesa-type structures 74 and 76 are shown as symmetrical in horizontal and vertical cross section, such symmetry is not required.

Mesa-type structures 74 and 76 including the exemplary thermal isolation structure 70 for thermal imaging systems 68 of FIG. 4 may be fabricated using conventional photolithographic techniques. Fabrication methods using photosensitive polyimide are preferred. However, for some applications, non-photosensitive polyimide may be used. Fabrication using photosensitive polyimide is recommended, because it generally requires fewer process steps.

One method to fabricate mesa-type structures 74 and 76 is to use photosensitive polyimide, forming the mesa structures by patterning a layer of photoresist on polyimide, and then developing the polyimide to remove the unexposed portions. This leaves the polyimide portion of the mesa structure with the desired configuration and array. The mesa conductors may then be formed with conventional metal deposition procedures on the exterior of the polyimide structure.

Once the array of mesa-type structures 74 and 76 have been defined, selected mesa strip conductors 78 and 80 may be formed using conventional photolithography techniques on the exterior of the respective mesas 74 and 76. Mesa strip conductors 78 and 80 are preferably formed on the exterior of their respective mesa-type structures 74 and 76 to extend from the top of their respective mesa-type structure to the respective contact pads 38 and 40.

Additional fabrication steps may be employed to deposit bump-bond metals 84 and 86 or conductive epoxies (not shown) on the top of mesa-type structures 74 and 76 as desired. These additional fabrication steps are accomplished with conventional materials and methods. The material selection depends upon the specific application for thermal isolation structure 70. Methods for forming thermal isolation structure 70 are described in U.S. patent application Ser. No. (Attorney Docket No. TI-18788 (32350-0901)), filed Jan. 13, 1994, entitled *Infrared Detector and Method* and U.S. Pat. No. 5,264,326, issued to Meissner, et al., entitled *Polyimide Thermal Isolation Mesa for a Thermal Imaging System*.

Figure 5:
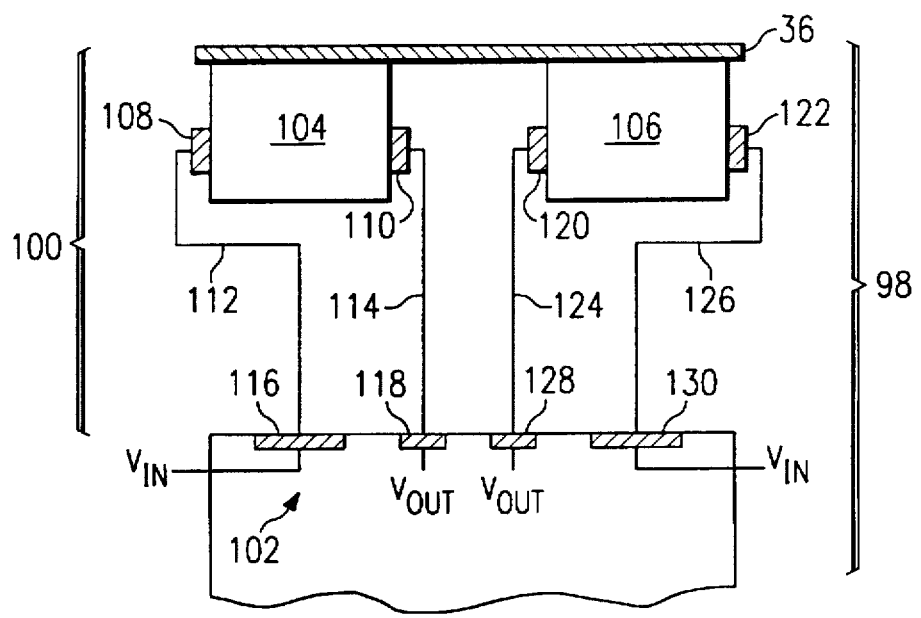
FIG. 5 is a schematic representation of an alternate configuration for the detector of the present invention.

FIG. 5 shows thermal imaging system 98 containing an alternate configuration for the present invention. Thermal imaging system 98 includes focal plane array 100 and IC substrate 102. Focal plane array 100 includes detector 104 and detector 106. Coupled to detector 104 are contact pads 108 and 110 that are respectively coupled to signal leads 112 and 114. Signal lead 112 is coupled to IC substrate 102 by contact pad 116, and signal lead 114 is coupled to IC substrate 102 by contact pad 118. Coupled to detector 106 are contact pads 120 and 122 that are coupled to signal leads 124 and 126, respectively. Signal lead 124 is coupled to IC substrate 102 by contact pad 128, and signal lead 126 is coupled to IC substrate 102 by contact pad 130. Detectors 104 and 106 are covered by plate 132.

Thermal imaging system 98 may be formed in accordance with the structure and processing techniques described for thermal imaging system 68 of FIG. 4. Each signal lead of thermal imaging system 98 could be provided to IC substrate 102 by a separate mesa-type structure.

Focal plane array 100 of FIG. 5 shows an alternate embodiment where the contact pads to the detectors are coupled on the sides of the detectors as opposed to the top and bottom surfaces as shown in FIGS. 2 and 4. By placing the contact pads on the sides of detectors 104 and 106 of focal plane array 100, the size of the detectors may be reduced so that their density may be increased within focal plane array 100. Increasing the density of the detectors within a focal plane array, in turn, increases the density of pixels within the focal plane array and the sensitivity of the thermal imaging system.

In operation of the present invention, by incorporating a ferroelectric thermal detector into a RC filter circuit, the amplitude of the signal from the filter circuit varies as the value of the detector capacitance (or resistance) varies through the impingement of infrared energy and temperature change. The detector may be resistive or capacitive within a RC network of the RC filter circuit. The amplitude of the output signal may be monitored so that the temperature of the detector within the focal plane array may be constantly determined.

The present invention provides technical advantages of eliminating the need for a chopper in order to take temperature measurements in a thermal imaging system. The present invention also allows for achieving greater density, lower power consumption, and reduced cost over previously developed thermal imaging systems.

Although the present invention and its advantages have been described in detail, it should be understood that various changes, substitutions and alterations may be made hereto without departing from the spirit and scope of the invention as defined by the appended claims.

What is claimed is:

1. A method for producing an image representative of an amount of thermal radiation incident to a thermal imaging system, the method comprising the steps of:

forming a layer of temperature sensitive material as a thermal detector and first element of a signal-producing circuit, the first element having one of a resistance and capacitance value depending on its temperature;

forming a second element of the signal-producing circuit complementary and electrically coupled to the first element;

providing an output signal having an amplitude from the signal-producing circuit, the amplitude of the output signal depending on the value of the first element and representing a temperature of the detector; and monitoring the amplitude of the output signal of the signal-producing circuit so as to detect a change in the temperature of the thermal detector.

2. The method of claim 1 wherein the first and second elements further comprise a resistor-capacitor (RC) network of a filter circuit.

3. The method of claim 2 wherein the first element is capacitive and the second element is resistive.

4. The method of claim 2 wherein the first element is resistive and the second element is capacitive.

5. The method of claim 2 wherein the filter circuit further comprises one of a high and low pass filter circuit.

6. The method of claim 1 wherein the forming a second element step further comprises forming the second element in an integrated circuit substrate.

7. The method of claim 1 wherein the forming a second element step further comprises forming the second element in an integrated circuit substrate and forming a support structure for providing thermal and electrical isolation between the thermal detector and the substrate.

8. The method of claim 1 wherein the temperature sensitive material further comprises a bolometric resistive material.

9. The method of claim 1 wherein the layer of temperature sensitive material comprises ferroelectric material.

10. The method of claim 1 wherein the layer of temperature sensitive material comprises one of barium strontium titanate, barium titanate, antimony sulfoiodide, vanadium oxide, lead titanate, lead lanthanum zirconium titanate, polysilicon, and amorphous silicon.

11. The method of claim 1 further comprising the step of forming an infrared absorber assembly extending outwardly from the thermal detector for interacting with infrared energy incident thereto and for producing a temperature change in the thermal detector.

12. The method of claim 1 wherein the monitoring step further comprises detecting a change in the amplitude of the output signal.

13. A thermal imaging system for providing an image representative of an amount of thermal radiation incident to the system, the system comprising:

a focal plane array comprising a plurality of thermal detectors, each detector comprising a layer of temperature sensitive material forming a first element of a signal-producing circuit, the first element having one of a resistance and capacitance value depending on its temperature;

an integrated circuit substrate comprising a plurality of second elements, each of the second elements part of one of a plurality of signal-producing circuits and complementary and electrically coupled to an associated first element, each signal-producing circuit operable to produce an output signal having an amplitude; and wherein the amplitude of each output signal is monitorable as representing an absolute temperature of the detector so as to determine the amount of thermal energy incident to the detector.

14. The system of claim 13 wherein each associated first and second element further comprise a resistor-capacitor (RC) network of a filter circuit.

15. The system of claim 13 further comprising a support structure providing thermal and electrical isolation between the plurality of thermal detectors and the substrate.

16. The system of claim 13 wherein the layer of temperature sensitive material comprises one of barium strontium titanate, barium titanate, antimony sulfoiodide, vanadium oxide, lead titanate, lead lanthanum zirconium titanate, polysilicon, and amorphous silicon.

17. The system of claim 13 further comprising an infrared absorber assembly extending outwardly from the thermal detectors for interacting with infrared energy incident thereto and for producing a temperature change in the thermal detectors.

18. A thermal imaging system for providing an image representative of thermal radiation incident to the system, the system comprising:

an array of thermal detectors, each detector comprising a layer of temperature sensitive material forming a first element of a signal-producing circuit, the first element having at least one of a resistance and capacitance value that depends on its temperature;

an array of the signal-producing circuits, each circuit comprising a second element complementary and electrically coupled to an associated first element, the signal-producing circuit operable to produce an output signal having an amplitude; and wherein the amplitude of the output signal is monitored as representing an absolute temperature of the detector so as to determine the amount of thermal energy incident to the system.

19. The system of claim 18 wherein the first and second elements further comprise a resistor-capacitor (RC) network of a filter circuit.

20. The system of claim 19 wherein the first element is capacitive and the second element is resistive.

21. The system of claim 19 wherein the first element is resistive and the second element is capacitive.

22. The system of claim 18 wherein the signal-producing circuit further comprises one of a high and low pass filter circuit.

23. The system of claim 18 further comprising a support structure providing thermal and electrical isolation between the thermal detector and the substrate.

24. The system of claim 18 wherein first and second electrical contacts couple to a top and bottom surface of the layer of temperature sensitive material.

25. The system of claim 18 wherein the first and second electrical contacts couple to a first and second side surface of the layer of the temperature sensitive material.

26. The system of claim 18 wherein the layer of temperature sensitive material further comprises barium strontium titanate.

27. The system of claim 18 wherein the layer of temperature sensitive material comprises one of barium strontium titanate, barium titanate, antimony sulfoiodide, vanadium oxide, lead titanate, lead lanthanum zirconium titanate, polysilicon, and amorphous silicon.

28. The system of claim 18 wherein the temperature sensitive material further comprises a bolometric resistive material.

29. The system of claim 18 wherein the temperature sensitive material further comprises ferroelectric material.

30. The system of claim 18 further comprising an infrared absorber assembly extending outwardly from the thermal detector for interacting with infrared energy incident thereto and for producing a temperature change in the thermal detector.

* * * * *